(12) United States Patent
Lee

(10) Patent No.: US 7,656,233 B2
(45) Date of Patent: Feb. 2, 2010

(54) APPARATUS FOR HIGH POWER AMPLIFIER IN WIRELESS COMMUNICATION SYSTEM

(75) Inventor: Jong-Hyun Lee, Suwon-si, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 12/019,779

(22) Filed: Jan. 25, 2008

(65) Prior Publication Data

US 2008/0186094 A1 Aug. 7, 2008

(30) Foreign Application Priority Data

Feb. 1, 2007 (KR) .................. 10-2007-0010599

(51) Int. Cl.
*H03F 3/04* (2006.01)

(52) U.S. Cl. ...................... 330/289; 330/296

(58) Field of Classification Search .................. 330/289, 330/296, 310; 455/127.1
See application file for complete search history.

(56) References Cited

U.S. PATENT DOCUMENTS

| | | | |
|---|---|---|---|
| 6,091,302 A * | 7/2000 | Arevalo | 330/289 |
| 6,194,968 B1 * | 2/2001 | Winslow | 330/289 |
| 6,958,649 B2 * | 10/2005 | Nagamori et al. | 330/289 |

* cited by examiner

*Primary Examiner*—Khanh V Nguyen
(74) *Attorney, Agent, or Firm*—Jefferson IP Law, LLP

(57) ABSTRACT

An apparatus for a High Power Amplifier (HPA) in a wireless communication system is provided. In one example, the apparatus includes a temperature sensor for determining temperature, a controller for receiving the determined temperature and for controlling a gate bias voltage corresponding to the determined temperature and an amplifier for amplifying a Radio Frequency (RF) signal by using the controlled gate bias voltage.

14 Claims, 8 Drawing Sheets

US 7,656,233 B2

APPARATUS FOR HIGH POWER AMPLIFIER IN WIRELESS COMMUNICATION SYSTEM

PRIORITY

This application claims the benefit under 35 U.S.C. § 119 (a) of a Korean patent application filed in the Korean Intellectual Property Office on Feb. 1, 2007 and assigned Serial No. 2007-10599, the entire disclosure of which is hereby incorporated by reference.

BACKGROUND OF THE INVENTION

1. Field of the Invention

The present invention relates to an apparatus for a High Power Amplifier (HPA) in a wireless communication system. More particularly, the present invention relates to an apparatus for an HPA which obtains optimal performance by controlling a gate bias input to a drive amplifier and a main amplifier according to temperature.

2. Description of the Related Art

A High Power Amplifier (HPA) used in a conventional wireless communication system includes a drive amplifier (hereinafter "amplifier" will also be referred to as "amp" for short) 111 and a main amp 113 as shown in FIG. 1. As also shown in FIG. 1, gate biases 101 and 103 and drain biases 105 and 107 are respectively applied to the drive amp 111 and the main amp 113 so as to amplify the voltage or power of an input signal. In the conventional system, the gate biases 101 and 103, as well as the drain biases 105 and 107, are fixed. In general, the fixed gate biases have values that are obtained by performing an aging operation at a room temperature (e.g. between 15 and 25° C.) during development of the HPA. In other words, during the design and development process of the HPA, the gate biases which provide optimal performance such that there is no gain variation during the process of performing the aging operation at room temperature are determined and set as the fixed gate biases.

However, according to a surrounding environment, the HPA may operate in a low temperature condition or in a high temperature condition. Furthermore, there is a standard in which the HPA must be able to perform a normal operation at a temperature between −40 and 52° C. in both indoor and outdoor environments.

Since the gate bias values of the conventional HPA are obtained by performing the aging operation at room temperature, optimal performance can be achieved only when the HPA operates at room temperature. Thus, the optimal performance cannot be achieved in other conditions, such as a low or high temperature condition. That is, when the conventional HPA operates at a low or high temperature condition, the optimal performance cannot be achieved due to the fixed gate bias. As a result, an Adjacent Channel Leakage Ratio (ACLR) and a constellation error become worse, which leads to deterioration in overall system performance.

SUMMARY OF THE INVENTION

An aspect of the present invention is to address at least the above-mentioned problems and/or disadvantages and to provide at least the advantages described below. Accordingly, an aspect of the present invention is to provide an apparatus for a High Power Amplifier (HPA) in a wireless communication system.

Another aspect of the present invention is to provide an apparatus for controlling a gate bias input to a drive amplifier and a main amplifier according to temperature in an HPA of a wireless communication system.

Another aspect of the present invention is to provide an apparatus for controlling a gate bias according to temperature by using a thermistor in an HPA of a wireless communication system.

Another aspect of the present invention is to provide an apparatus for controlling a gate bias according to temperature by measuring temperature in an HPA of a wireless communication system.

According to an aspect of the present invention, an apparatus for an HPA in a wireless communication system is provided. The apparatus includes a temperature sensor for measuring temperature, a controller for receiving the measured temperature from the temperature sensor and for controlling an externally provided voltage to a gate bias voltage corresponding to the measured temperature by using a pre-stored table in which gate bias voltages are shown at different temperatures and an amplifier for amplifying a Radio Frequency (RF) signal by using the controlled gate bias voltage.

According to another aspect of the present invention, an apparatus for an HPA in a wireless communication system is provided. The apparatus includes a power supply for supplying an externally provided voltage, a temperature compensation circuit for controlling the externally provided voltage according to temperature by using a thermistor and an amplifier for amplifying an RF signal by using the controlled voltage as a gate bias voltage.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will become more apparent from the following detailed description taken in conjunction with the accompanying drawings in which.

Throughout the drawings, it should be noted that like reference numbers are used to depict the same or similar elements, features and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Hereinafter, an exemplary apparatus of the present invention will be described which controls a gate bias input to a drive amplifier (hereinafter "amplifier" will also be referred to as "amp" for short) and a main amp according to temperature in a High Power Amplifier (HPA) of a wireless communication system.

Figure 1:
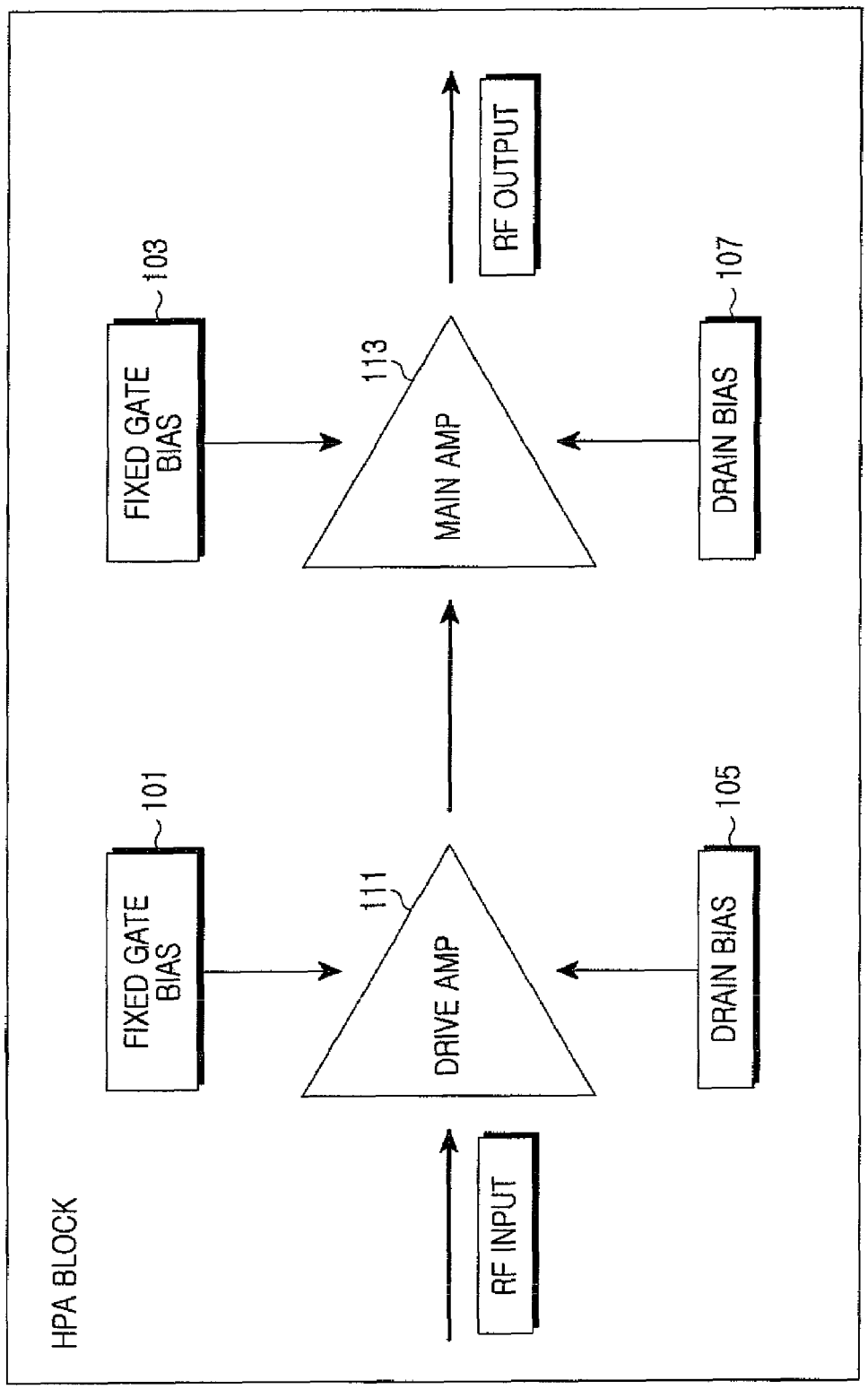
FIG. 1 is a block diagram illustrating a conventional High Power Amplifier (HPA)
Figure 2:
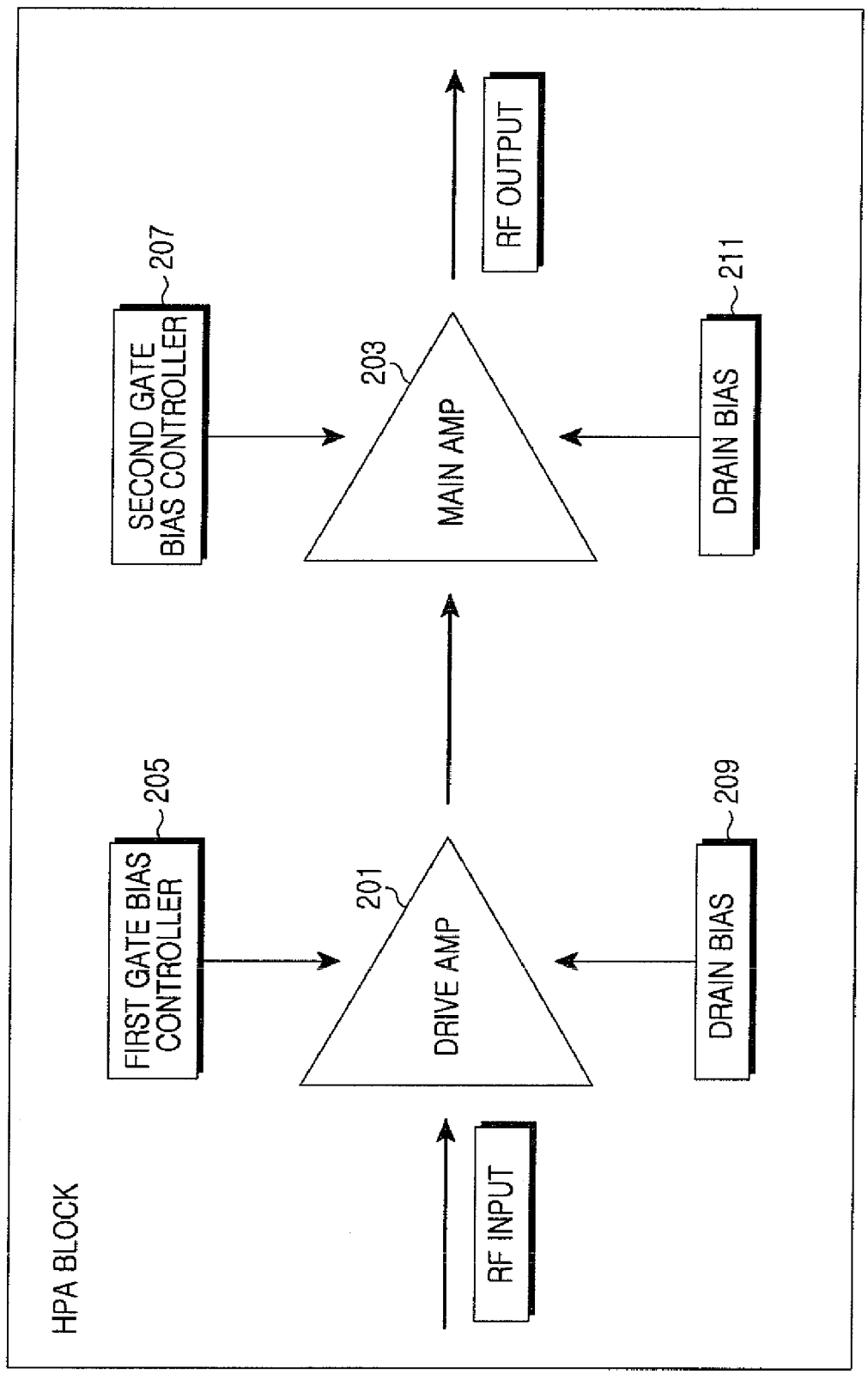
FIG. 2 is a block diagram illustrating an HPA in a wireless communication system according to an exemplary embodiment of the present invention.

FIG. 2 is a block diagram illustrating an HPA in a wireless communication system according to an exemplary embodiment of the present invention. The HPA includes a drive amp 201, a main amp 203, a first gate bias controller 205, and a second gate bias controller 207.

The drive amp 201 amplifies the voltage or power of an input Radio Frequency (RF) signal by using a drain bias 209 and a gate bias that is input from the first gate bias controller 205. The drive amp 201 then outputs the amplified RF signal to the main amp 203. The main amp 203 re-amplifies the voltage or power of the amplified RF signal input from the drive amp 201 by using a drain bias 211 and a gate bias that is input from the second gate bias controller 207. The drive amp 201 is used to compensate for an insufficient gain of the main amp 203.

The first gate bias controller 205 and the second gate bias controller 207 control their gate bias (or Direct Current (DC) voltage) values according to a temperature at which the HPA operates. The first gate bias controller 205 and the second gate bias controller 207 output their controlled values to the drive amp 201 and the main amp 203, respectively. In an exemplary implementation, the first and second gate bias controllers 205 and 207 control the gate bias values so that the drive amp 201 and the main amp 203 can provide optimal performance according to temperature. For example, the first and second gate bias controllers 205 and 207 may control their output values according to an ambient temperature or a temperature of a specific component or location. The gate bias values, at which the amps 201 and 203 can provide optimal performance, can be determined by carrying out experiments at different temperatures. In addition, the gate bias values may vary depending on transistor characteristics of the amps 201 and 203.

Controlling of the gate bias values according to temperature may be performed either by using a thermistor, which is a sensor whose resistance changes with temperature, or by measuring a temperature. The two methods of controlling the gate bias value by using a thermistor or through temperature measurement will be described below.

Figure 3:
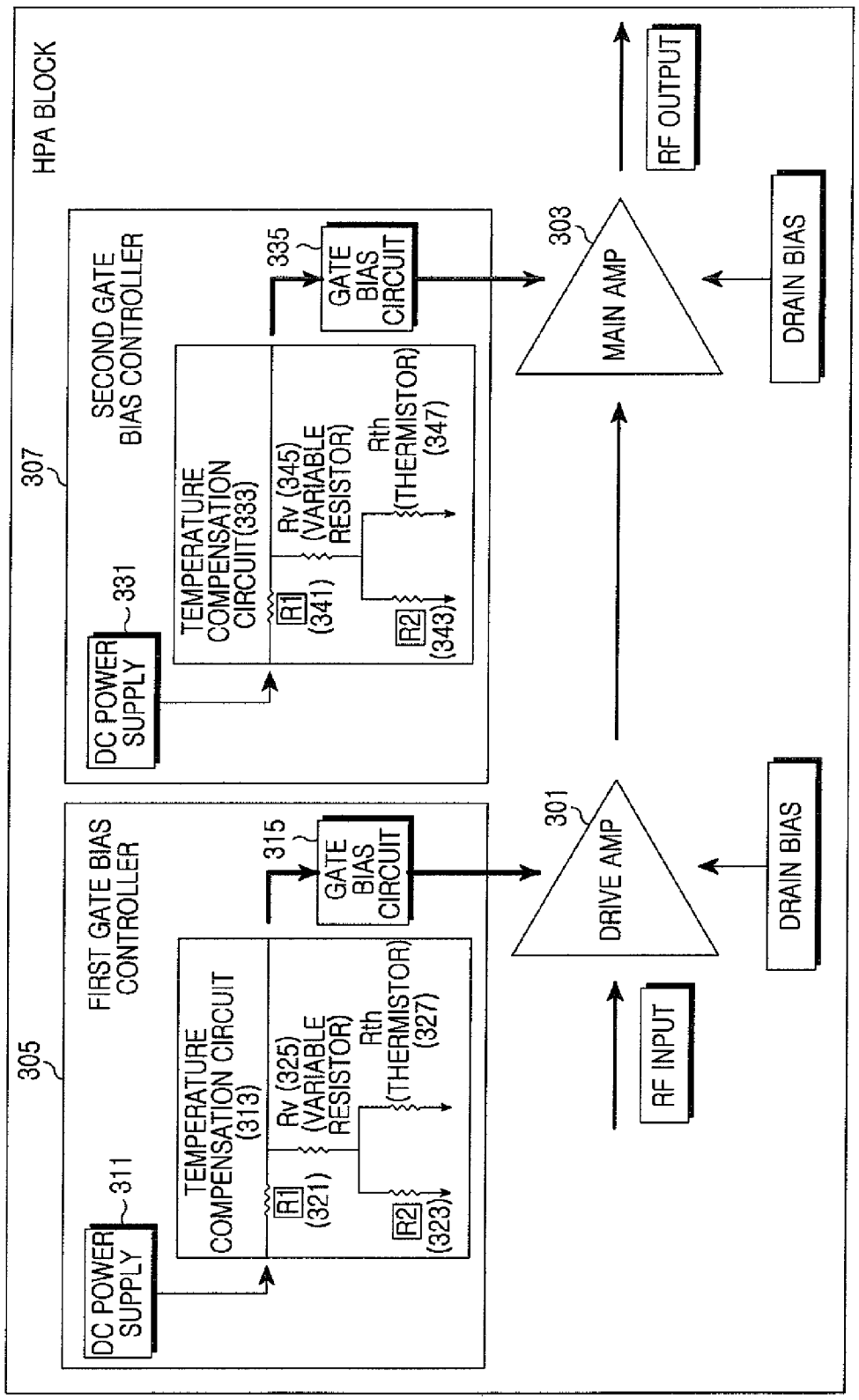
FIG. 3 is a block diagram illustrating an HPA for controlling a gate bias by using a thermistor in a wireless communication system according to an exemplary embodiment of the present invention.

FIG. 3 is a block diagram illustrating an HPA for controlling a gate bias by using a thermistor in a wireless communication system according to an exemplary embodiment of the present invention. Herein, a first gate bias controller 305 and a second gate bias controller 307 respectively include DC power supplies 311 and 331, temperature compensation circuits 313 and 333 and gate bias circuits 315 and 335.

Referring to FIG. 3, the DC power supplies 311 and 331 stabilize DC power supplied from external elements and then output the stabilized power to the temperature compensation circuits 313 and 333.

The temperature compensation circuits 313 and 333 respectively include first fixed resistors (indicated by R1) 321 and 341, second fixed resistors (indicated by R2) 323 and 343, variable resistors (indicated by Rv) 325 and 345 and thermistors (indicated by Rth) 327 and 347. As will be explained in more detail below, by using the resistors, the temperature compensation circuits 313 and 333 control DC voltages output to the gate bias circuits 315 and 335, respectively.

Specifically, the DC voltages input from the DC power supplies 311 and 331 are subject to voltage division according to resistances of the variable resistors 325 and 345, the second fixed resistors 323 and 343 and the thermistors 327 and 347. In one example as illustrated in FIG. 3, the variable resistors 325 and 345 are connected in series to the parallel connected second fixed resistors 323 and 343 and the thermistors 327 and 347, thereby determining output voltages. Using the thermistors 327 and 347, whose resistances change with temperature, the output voltages are controlled to be at a level suitable for a current temperature. Since a drive amp 301 and a main amp 303 have different transistor characteristics, the first resistors 321 and 341, the second resistors 323 and 343, and the variable resistors 325 and 345, which are respectively included in the two temperature compensation circuits 313 and 333, may have different resistances. That is, they may have different resistances from other resistors in the same circuit (e.g. first resistor 321 may have a different resistance than second resistor 323), as well as different resistances from their counterpart resistors in the other circuit (e.g. first resistor 321 may have a different resistance than first resistor 341).

An output gate bias value that results from the voltage division by the circuit illustrated in FIG. 3 is expressed by Equation (1) below.

$$\text{gate bias}_{output} = \text{gate bias}_{input} \left( \frac{Rv + \frac{R2 \cdot Rth}{R2 + Rth}}{R1 + \left(Rv + \frac{R2 \cdot Rth}{R2 + Rth}\right)} \right) \quad (1)$$

In Equation (1), gate bias$_{output}$ denotes a DC voltage output to the drive amp 301 and the main amp 303 via the gate bias circuits 315 and 335, respectively. Furthermore, gate bias$_{input}$ denotes a DC voltage applied from the DC power supplies 311 and 331 to the temperature compensation circuits 313 and 333, respectively. It is to be understood that the gate bias$_{output}$ supplied to the drive amp 301 is not necessarily the same voltage as the gate bias$_{output}$ supplied to the main amp 303. Similarly, it is to be understood that the gate bias$_{input}$ supplied to the temperature compensation circuit 313 is not necessarily the same voltage as the gate bias$_{input}$ supplied to the temperature compensation circuit 333.

Herein, values of R1 and R2 can be determined by using a voltage division formula as shown in Equation (1). That is, given an input gate bias value, in a case where output gate bias values that provide optimal performance are determined at different temperatures, either by experiment or calculation, the values of R1 and R2 can be determined by substituting a thermistor resistance Rth predetermined at different temperatures into Equation (1) above. However, even if the HPA uses the values of R1 and R2 determined by performing the above calculation, characteristics of the drive amp 301 and the main amp 303 may not be completely compensated for because the thermistor resistance Rth is a conventional representative value rather than a real value and also because of resistance errors or tolerances. Therefore, it is preferable to obtain the values of R1 and R2 by repeating temperature experiments several times.

A thermistor can be classified into two types. A Negative Temperature Coefficient (NTC) thermistor is a thermistor whose resistance decreases with temperature. A Positive Temperature Coefficient (PTC) thermistor is a thermistor whose resistance increases with temperature. The thermistor type best suited for a given circuit may be determined according to a transistor (i.e., amp) characteristic. Although the present example has been described under the assumption that the NTC-type thermistor is used, the PTC-type thermistor may also be used according to the transistor characteristic.

The gate bias circuits 315 and 335 receive the DC voltages controlled by the temperature compensation circuits 313 and 333 according to temperature, remove noise from the DC voltages and output the noise-removed voltages to the drive amp 301 and the main amp 303, respectively.

Figure 4:
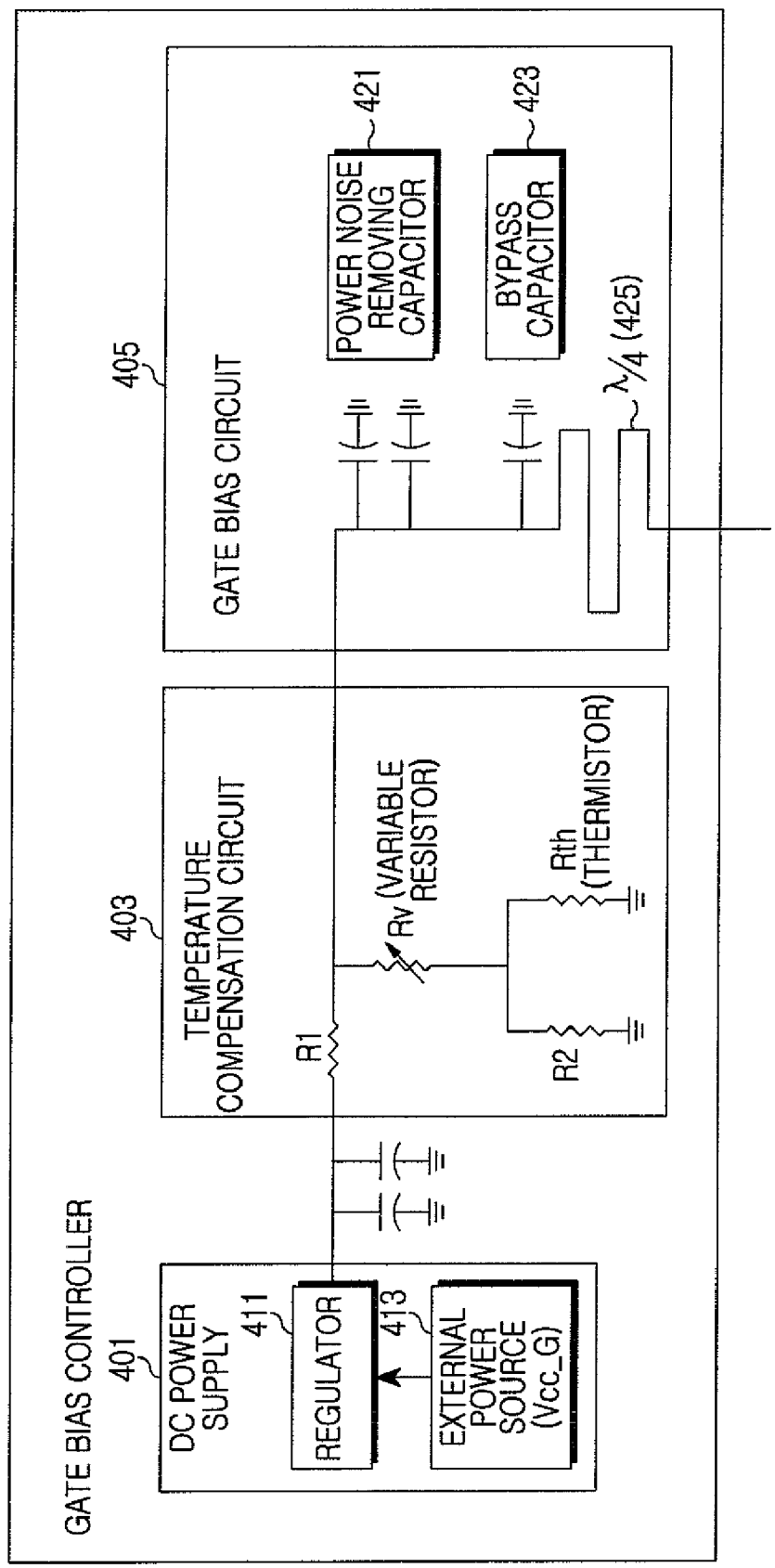
FIG. 4 is a block diagram illustrating a gate bias controller for controlling a gate bias by using a thermistor in an HPA according to an exemplary embodiment of the present invention.

The aforementioned first and second gate bias controllers 305 and 307 may be implemented as illustrated in FIG. 4. That is, the first and second gate bias controllers 305 and 307 may each include a DC power supply 401, a temperature compensation circuit 403 and a gate bias circuit 405. The DC power supply 401 may include an external power source 413 and a regulator 411. The gate bias circuit 405 may include a power noise removing capacitor 421, a bypass capacitor 423 and a λ/4 transmission line 425. The bypass capacitor 423 and the λ/4 transmission line 425 pass only DC power and block an RF signal received from the drive amp 301 and the main amp 303.

Figure 5:
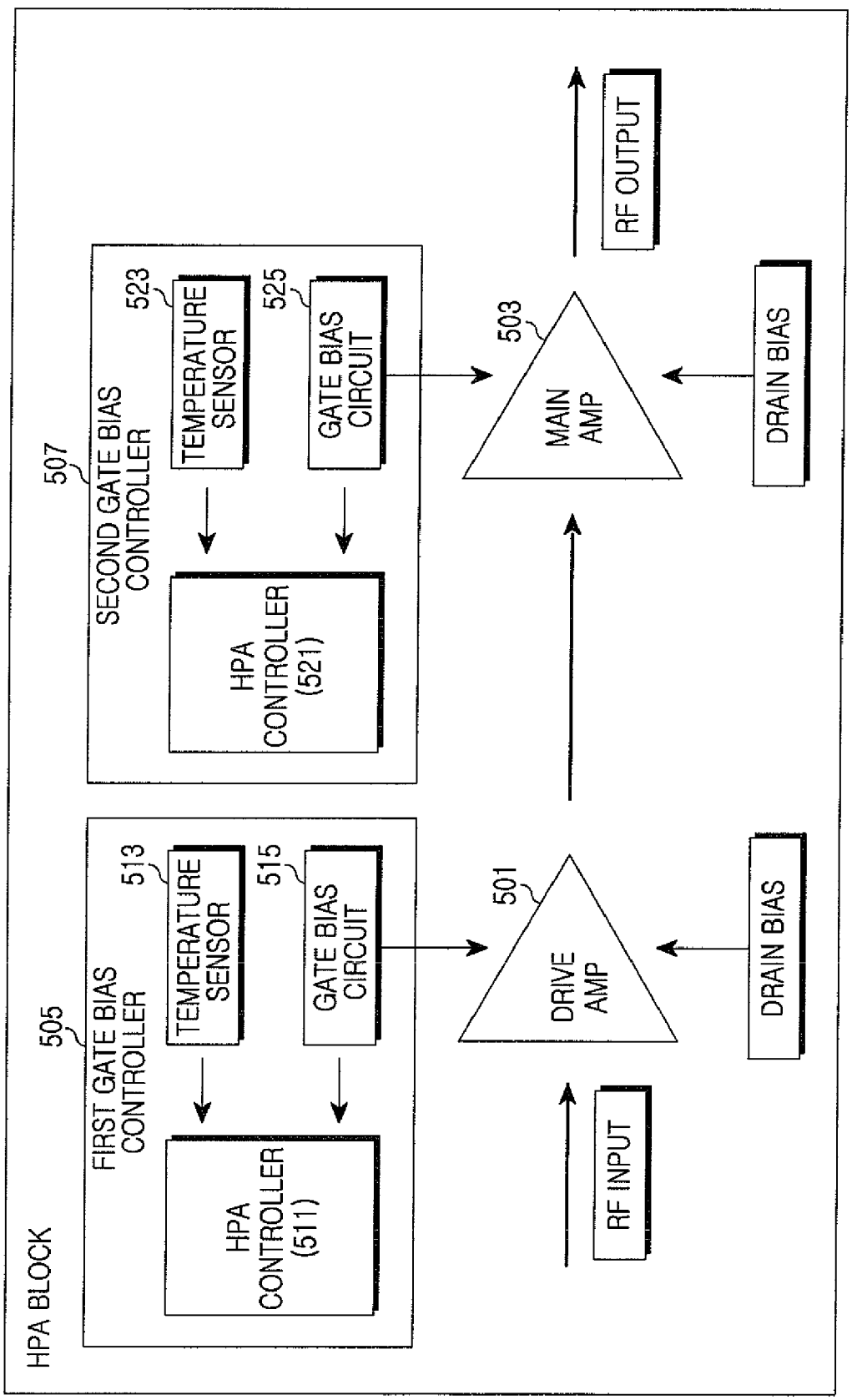
FIG. 5 is a block diagram illustrating an HPA for controlling a gate bias by measuring temperature in a wireless communication system according to an exemplary embodiment of the present invention.

FIG. 5 is a block diagram illustrating an HPA for controlling a gate bias by measuring temperature in a wireless communication system according to an exemplary embodiment of the present invention. Herein, a first gate bias controller 505 and a second gate bias controller 507 respectively include HPA controllers 511 and 521, temperature sensors 513 and 523 and gate bias circuits 515 and 525.

Referring to FIG. 5, the temperature sensors 513 and 523 are located as close as possible to transistors of the two amps 501 and 503, so as to provide the most accurate indication of the temperatures of the transistors. The temperature sensors 513 and 523 provide the measured temperatures to the HPA controllers 511 and 521, respectively. Of course, the location of temperature sensors 513 and 523 may be changed depending on the desired input. For example, it may be determined that ambient temperature is a better indication of amplifier performance so that temperature sensors 513 and 523 are located in a general area.

The HPA controllers 511 and 521 are provided with relevant temperature information from the temperature sensors 513 and 523, respectively. In on example, the HPA controllers 511 and 521 are provided with information concerning temperatures of the transistors of the two amps 501 and 503. Using the provided temperature information, the HPA controllers determine gate bias values, which are suitable for the temperatures of the transistors, control externally provided DC power according to the determined gate bias values and output the controlled DC voltages to the gate bias circuits 515 and 525. In one implementation, gate bias values, at which the two amps 513 and 523 can provide optimal performance for a given temperature, are tabled according to temperature and are stored in advance by the HPA controllers 511 and 521.

The gate bias circuits 515 and 525 receive the DC voltages output from the HPA controllers 511 and 521 according to temperature, remove noise from the DC voltages and output the noise-removed DC voltages to the drive amp 501 and the main amp 503, respectively.

Figure 6:
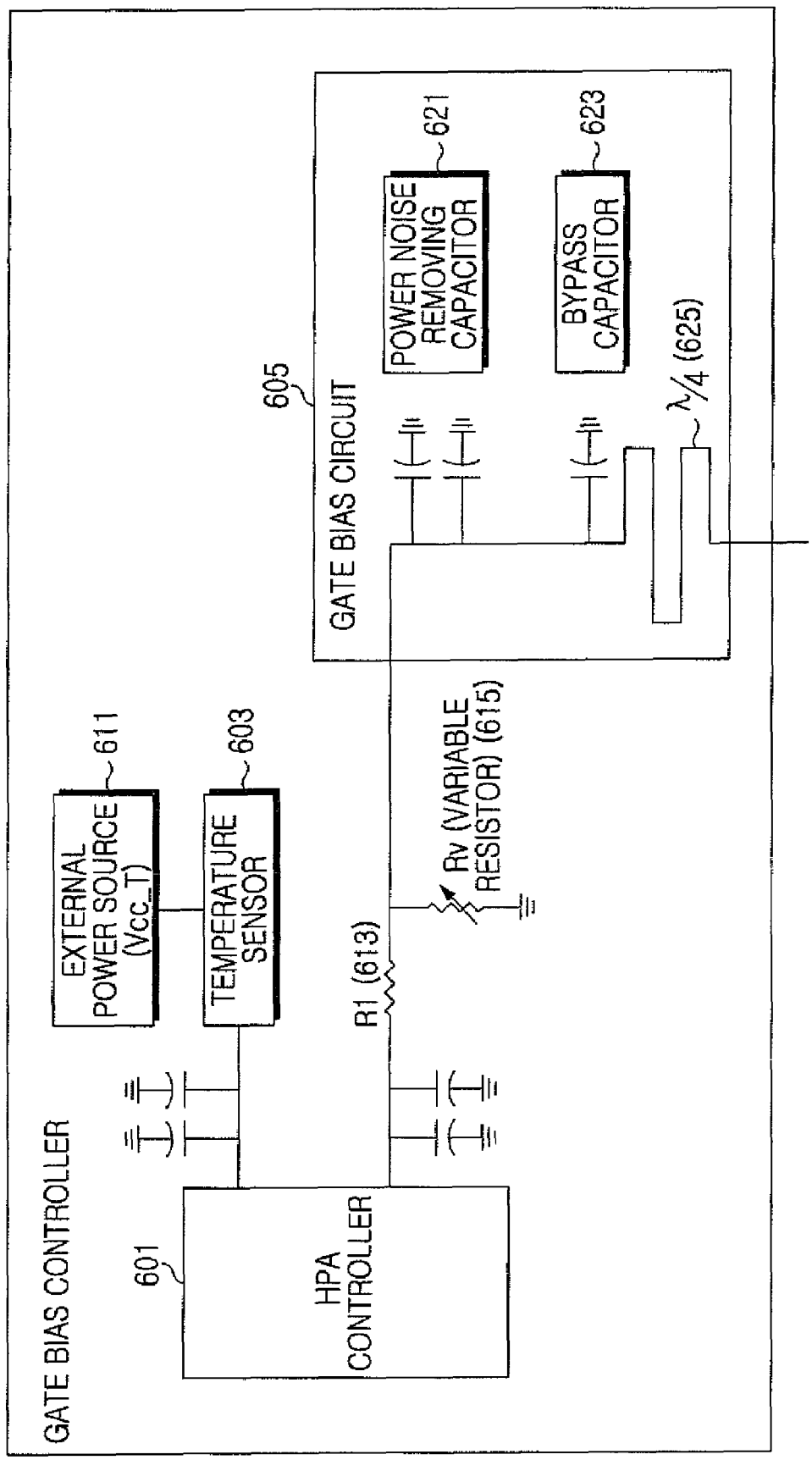
FIG. 6 is a block diagram illustrating a gate bias controller for controlling a gate bias by measuring temperature in an HPA according to an exemplary embodiment of the present invention.

The aforementioned gate bias controllers 505 and 507 may be implemented as illustrated in FIG. 6. That is, in addition to an HPA controller 601, a temperature sensor 603 and a gate bias circuit 605, the gate bias controllers 505 and 507 may each include an external power source 611 that applies external power to the temperature sensor 603, a fixed resistor (indicated by R1) 613 that precisely controls a DC voltage (i.e., gate bias) output from the HPA controller 601, and a variable resistor (indicated by Rv) 615. The gate bias circuit 605 may include a power noise removing capacitor 621, a bypass capacitor 623 and a λ/4 transmission line 625. The bypass capacitor 623 and the λ/4 transmission line 625 pass only DC power and block an RF signal received from the two amps 501 and 503.

Figure 7:
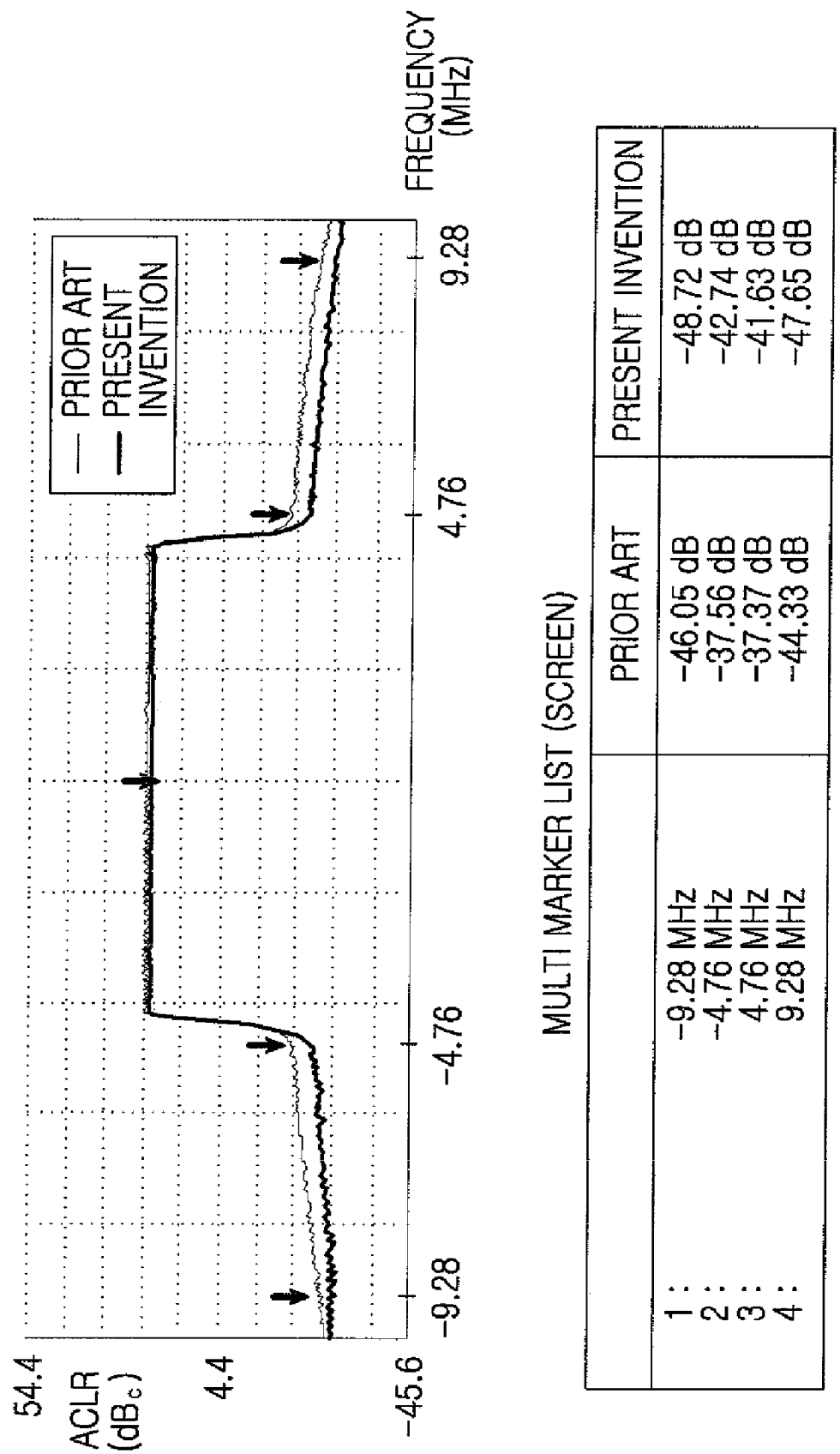
FIG. 7 is a graph illustrating an experimental result obtained by measuring an Adjacent Channel Leakage Ratio (ACLR) when a gate bias is controlled by temperature in an HPA according to an exemplary embodiment of the present invention.
Figure 8:
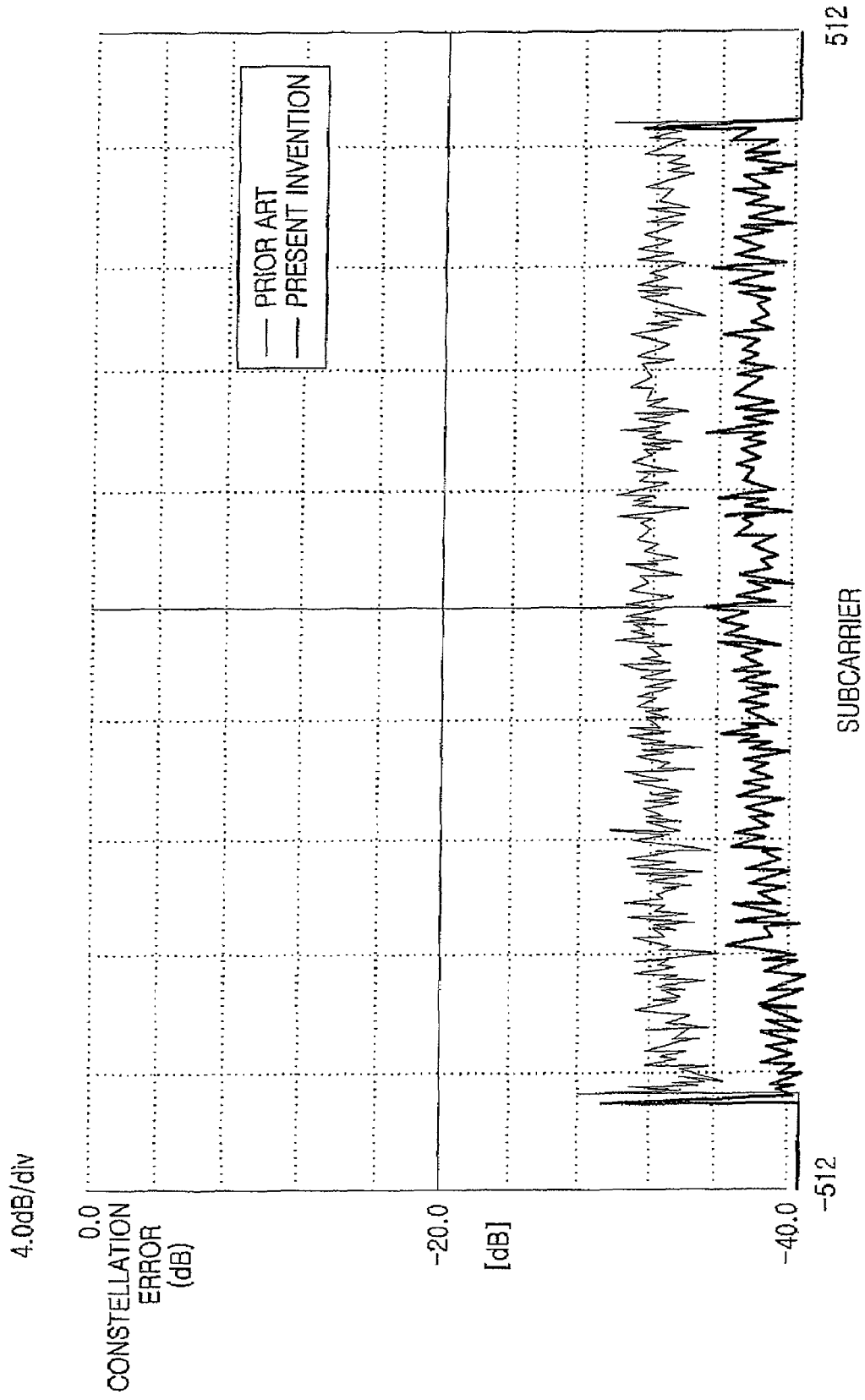
FIG. 8 is a graph illustrating an experimental result obtained by measuring a constellation error when a gate bias is controlled by temperature in an HPA according to an exemplary embodiment of the present invention.

FIGS. 7 and 8 are graphs illustrating experimental results obtained when a gate bias is controlled by temperature in an HPA according to an exemplary embodiment of the present invention.

FIG. 7 is a graph illustrating a result obtained by measuring an Adjacent Channel Leakage Ratio (ACLR) when an HPA operates in a high temperature condition of 50° C. FIG. 8 is a graph illustrating a result obtained by measuring a constellation error when the HPA operates in the same high temperature condition of 50° C. In the following descriptions, the horizontal axis of the graph of FIG. 7 represents a frequency, and the vertical axis thereof represents a magnitude of the ACLR. In addition, the horizontal axis of the graph of FIG. 8 represents a frequency, and the vertical axis thereof represents a magnitude of the constellation error.

Referring to FIG. 7, in general, the ACLR of the HPA is about −41 $dB_c$ at room temperature when a frequency offset is 4.77 MHz. However, if the HPA uses a fixed gate bias according to the conventional art, the ACLR becomes −37.37 $dB_c$ at the high temperature condition when the frequency offset is 4.77 MHz, which shows characteristic deterioration by about 4 dB in comparison with the room temperature. On the contrary, if the HPA uses a gate bias that changes with temperature according to an exemplary embodiment of the present invention, the ACLR is −41.63 $dB_c$ at the high temperature condition, which is similar to the characteristic at the room temperature when the frequency offset is 4.77 MHz.

Referring to FIG. 8, in general, the constellation error of the HPA is required to be −35 dB or more at room temperature. However, when the HPA uses the fixed gate bias according to the conventional art, the constellation error is about −28 dB, which does not satisfy such requirement. On the contrary, if the HPA uses a gate bias that changes with temperature according to an exemplary embodiment of the present invention, the constellation error of the HPA becomes −37 dB or more, which shows improvement of about 9 dB or more in comparison with the conventional art, and also satisfies the requirement of having the constellation error of −35 dB or more.

According to exemplary embodiments of the present invention, a gate bias input to a drive amp and a main amp is controlled and applied according to temperature in an HPA used in a wireless communication system. Therefore, there is an advantage in that performance deterioration caused by a transistor temperature can be reduced. In addition, since a gate bias may be controlled according to a current temperature by using a pre-stored table, the gate bias can be easily controlled and prevent performance deterioration that would otherwise occur at an extreme temperature. Therefore, there is an advantage in that performance can be prevented from deterioration and optimal performance can be achieved.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the invention is defined not by the detailed description of the invention but by the appended claims and their equivalents and all differences within the scope will be construed as being included in the present invention.

What is claimed is:

1. An apparatus for a High Power Amplifier (HPA) in a wireless communication system, the apparatus comprising:
    a temperature sensor for determining temperature;
    a controller for receiving the determined temperature and for controlling a gate bias voltage corresponding to the determined temperature;
    an amplifier for amplifying a Radio Frequency (RF) signal by using the controlled gate bias voltage; and
    a gate bias circuit between the controller and the amplifier for removing noise from the gate bias voltage controlled by the controller and for preventing the RF signal of the amplifier from inputting to the controller.

2. The apparatus of claim 1, wherein the controller controls the gate bias voltage in correspondence to values in a pre-stored table.

3. The apparatus of claim 2, wherein the values in the pre-stored table comprise gate bias voltages to be input to the amplifier at different temperatures.

4. The apparatus of claim 1, wherein the gate bias circuit comprises:
    a capacitor for removing the noise from the gate bias voltage controlled by the controller;
    a bypass capacitor; and
    a transmission line, wherein each of the bypass capacitor and the transmission line are for providing the gate bias voltage to the amplifier and for blocking the RF signal.

5. An apparatus for a High Power Amplifier (HPA) in a wireless communication system, the apparatus comprising:
    a power supply for supplying a voltage;
    a temperature compensation circuit, comprising two fixed resistors, a variable resistor and a thermistor, for controlling the supplied voltage according to temperature; and
    an amplifier for amplifying a Radio Frequency (RF) signal by using the controlled voltage as a gate bias voltage.

6. The apparatus of claim 5, wherein the supplied voltage is controlled by using Equation:

$$\text{gate bias}_{output} = \text{gate bias}_{input} \left( \frac{Rv + \frac{R2 \cdot Rth}{R2 + Rth}}{R1 + \left(Rv + \frac{R2 \cdot Rth}{R2 + Rth}\right)} \right),$$

where gate bias$_{output}$ denotes a voltage controlled by the temperature compensation circuit, gate bias$_{input}$ denotes the supplied voltage, R1 and R2 denote resistances of the fixed resistors, Rv denotes a resistance of the variable resistor, and Rth denotes a resistance of the thermistor.

7. The apparatus of claim 5, further comprising a gate bias circuit between the temperature compensation circuit and the amplifier for removing noise from the voltage controlled by the temperature compensation circuit and for preventing the RF signal of the amplifier from inputting to the temperature compensation circuit.

8. The apparatus of claim 7, wherein the gate bias circuit comprises:
    a capacitor for removing noise from the voltage controlled by the temperature compensation circuit;
    a bypass capacitor; and
    a transmission line, wherein each of the bypass capacitor and the transmission line are for delivering the voltage and for blocking the RF signal.

9. An apparatus for a High Power Amplifier (HPA), the apparatus comprising:
    a power supply for supplying power;
    a thermistor for providing a variable output corresponding to a resistance of the thermistor which varies depending on a sensed temperature;
    a control circuit, comprising two fixed resistors, a variable resistor and the thermistor, for supplying a bias voltage corresponding to the sensed temperature; and
    an amplifier for amplifying a signal using the bias voltage.

10. The apparatus of claim 9, wherein the control circuit receives power from the power supply and controls the received power corresponding to the sensed temperature to supply the bias voltage.

11. The apparatus of claim 9, wherein the sensor senses the temperature and provides the variable output which corresponds to a value in a pre-stored table.

12. The apparatus of claim 9, wherein the bias voltage is supplied according to Equation:

$$\text{gate bias}_{output} = \text{gate bias}_{input} \left( \frac{Rv + \frac{R2 \cdot Rth}{R2 + Rth}}{R1 + \left(Rv + \frac{R2 \cdot Rth}{R2 + Rth}\right)} \right),$$

where gate bias$_{output}$ denotes the bias voltage supplied by the control circuit, gate bias$_{input}$ denotes a voltage received from the power supply, R1 and R2 denote resistances of the fixed resistors, Rv denotes a resistance of the variable resistor, and Rth denotes a resistance of the thermistor.

13. The apparatus of claim 9, further comprising a bias circuit between the control circuit and the amplifier for removing noise from the bias voltage supplied by the control circuit and for preventing the signal of the amplifier from inputting to the control circuit.

14. The apparatus of claim 13, wherein the bias circuit comprises:
    a capacitor for removing the noise from the bias voltage supplied by the control circuit;
    a bypass capacitor; and
    a transmission line, wherein each of the bypass capacitor and the transmission line are for delivering the voltage to the amplifier and for blocking the signal.

* * * * *